(12) United States Patent
Oyer

(10) Patent No.: US 11,257,982 B1
(45) Date of Patent: Feb. 22, 2022

(54) SEMICONDUCTOR DISPLAY DEVICE

(71) Applicant: Facebook Technologies, LLC, Menlo Park, CA (US)

(72) Inventor: Céline Claire Oyer, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/600,896

(22) Filed: Oct. 14, 2019

Related U.S. Application Data

(60) Provisional application No. 62/747,564, filed on Oct. 18, 2018.

(51) Int. Cl.
*H01L 33/20* (2010.01)
*H01L 33/06* (2010.01)
*H01L 33/14* (2010.01)

(52) U.S. Cl.
CPC .......... *H01L 33/20* (2013.01); *H01L 33/06* (2013.01); *H01L 33/145* (2013.01)

(58) Field of Classification Search
CPC ........ H01L 33/20; H01L 33/145; H01L 33/06
See application file for complete search history.

(56) References Cited

U.S. PATENT DOCUMENTS

| | | | |
|---|---|---|---|
| 10,326,045 B2 | 6/2019 | Lo et al. | |
| 2005/0059178 A1* | 3/2005 | Erchak | H01L 33/0093 438/22 |
| 2005/0145864 A1* | 7/2005 | Sugiyama | H01L 33/22 257/95 |
| 2005/0264172 A1* | 12/2005 | Wojnarowski | H01L 33/08 313/498 |
| 2006/0057850 A1 | 3/2006 | Britt et al. | |
| 2006/0113638 A1* | 6/2006 | Maaskant | H01L 33/20 257/623 |
| 2006/0186420 A1* | 8/2006 | Hirukawa | B82Y 20/00 257/82 |
| 2011/0297914 A1* | 12/2011 | Zheng | H01L 33/46 257/13 |
| 2014/0166975 A1* | 6/2014 | Ito | H01L 33/38 257/13 |
| 2014/0267683 A1 | 9/2014 | Bibl et al. | |
| 2015/0155261 A1 | 6/2015 | Uhm et al. | |

(Continued)

OTHER PUBLICATIONS

U.S. Appl. No. 16/595,870, "Non-Final Office Action", dated May 28, 2021, 8 pages.

(Continued)

*Primary Examiner* — Sitaramarao S Yechuri
(74) *Attorney, Agent, or Firm* — Kilpatrick Townsend & Stockton LLP

(57) ABSTRACT

A LED device is provided. In one example, the LED device comprises: an electrical contact; and an epitaxial structure having a mesa shape and including: a first doped semiconductor layer; a second doped semiconductor layer; and a quantum well layer between the first doped semiconductor layer and the second doped semiconductor layer. The electrical contact is formed on the first doped semiconductor layer. The first doped semiconductor layer comprises a protrusion region between the electrical contact and the quantum well layer. The protrusion region facilitates movement of charges from the electrical contact to a limited region of the quantum well layer.

21 Claims, 12 Drawing Sheets

(56) References Cited

U.S. PATENT DOCUMENTS

| | | | |
|---|---|---|---|
| 2015/0311415 A1* | 10/2015 | Song | H01L 33/62 |
| | | | 257/91 |
| 2016/0315218 A1 | 10/2016 | Bour et al. | |
| 2017/0069804 A1 | 3/2017 | Lin et al. | |
| 2017/0142874 A1 | 5/2017 | Pourchet et al. | |
| 2017/0215280 A1 | 7/2017 | Chaji | |
| 2017/0271557 A1* | 9/2017 | Brennan | H01L 33/58 |
| 2017/0338374 A1 | 11/2017 | Zou et al. | |
| 2018/0006083 A1 | 1/2018 | Zhu et al. | |
| 2018/0261582 A1 | 9/2018 | Henry et al. | |
| 2018/0277524 A1 | 9/2018 | Moon et al. | |
| 2019/0051637 A1 | 2/2019 | Lo et al. | |
| 2019/0051792 A1 | 2/2019 | Lo et al. | |
| 2019/0088821 A1* | 3/2019 | Oike | H01L 33/20 |
| 2019/0139794 A1 | 5/2019 | Saketi et al. | |
| 2020/0128708 A1 | 4/2020 | Saketi | |
| 2020/0303585 A1 | 9/2020 | Lo et al. | |

OTHER PUBLICATIONS

U.S. Appl. No. 16/595,870, "Notice of Allowance", dated Feb. 9, 2021, 8 pages.

U.S. Appl. No. 16/595,948, "Corrected Notice of Allowability", dated Jul. 23, 2021, 7 pages.

U.S. Appl. No. 16/595,948, "Non-Final Office Action", dated Dec. 31, 2020, 12 pages.

U.S. Appl. No. 16/595,948, "Notice of Allowance", dated Jun. 16, 2021, 10 pages.

U.S. Appl. No. 16/595,870 , "Notice of Allowance", dated Sep. 17, 2021, 8 pages.

U.S. Appl. No. 16/595,948 , "Corrected Notice of Allowability", dated Sep. 13, 2021, 7 pages.

\* cited by examiner

SEMICONDUCTOR DISPLAY DEVICE

CROSS-REFERENCE TO RELATED APPLICATIONS

This application claims the benefit of U.S. Provisional Application No. 62/747,564, filed Oct. 18, 2018, entitled "Semiconductor Display Device" which is incorporated herein by reference in its entirety.

BACKGROUND

The disclosure relates generally to display technologies, and more specifically to display devices including light emitting diodes.

Displays are ubiquitous and are a core component of wearable devices, smart phones, tablets, laptops, desktops, TVs and display systems. Common display technologies today include, for example, Light Emitting Diode (LED) displays. For example, LEDs can be used to form individual pixel elements in an electronic display. The LEDs can be configured to generate collimated light, which can propagate as parallel light rays with reduced or no divergence. The generation of collimated light can improve light output efficiency of the LED. However, numerous challenges exist to achieve a high degree of collimation from the LEDs. There is a need to address such challenges and to improve the collimation and efficiency of LED designs.

SUMMARY

The present disclosure relates to display technologies. More specifically, and without limitation, this disclosure relates to an LED device. The LED device may include an electrical contact and an epitaxial structure having a mesa shape. The epitaxial structure may include a first doped semiconductor layer, a second doped semiconductor layer, and a quantum well layer between the first doped semiconductor layer and the second doped semiconductor layer. The electrical contact is formed on the first doped semiconductor layer. The first doped semiconductor layer comprises a protrusion region between the electrical contact and the quantum well layer. The protrusion region facilitates movement of charges from the electrical contact to a limited region of the quantum well layer.

In some aspects, the LED device further comprises a depression region surrounding the protrusion region and above the quantum well layer. The depression region restricts charge travel paths within the first doped semiconductor layer and facilitates the movement of the charges from the electrical contact to the limited region of the quantum well layer.

In some aspects, the depression region touches the quantum well layer at one or more locations such that a thickness of the first doped semiconductor layer between the depression region and the quantum well layer at the one or more locations is smaller than a thickness of the protrusion region.

In some aspects, the depression region intersects the quantum well layer and divides the quantum well layer into a plurality of regions.

In some aspects, the LED device further comprises one or more charge blocking layers at one or more interfaces between the depression region and the quantum well layer to block charges from bypassing the quantum well layer via the one or more interfaces.

In some aspects, the depression region is a first depression region. The LED device further comprises a second depression region surrounding the first depression region and the electrical contact.

In some aspects, the depression region has a curved sidewall.

In some aspects, the depression region has a vertical sidewall.

In some aspects, the depression region has a flat bottom surface.

In some aspects, the depression region has a curved bottom surface.

In some aspects, the depression region does not fully enclose the electrical contact.

In some aspects, the LED device further comprises an insulation material surrounding the protrusion region.

In some aspects, the insulation material extends to a perimeter of the quantum well layer.

In some aspects, the insulation material comprises at least one of: a silicon oxide material, a silicon nitride material, or a polymer.

In some aspects, a sidewall of the mesa includes an internal parabolic reflective surface.

In some aspects, a center of the limited region is co-located with a focal point of the internal parabolic reflective surface.

In some aspects, the first doped semiconductor layer includes a P-type semiconductor material. The second doped semiconductor layer include an N-type semiconductor material.

In some aspects, the epitaxial structure includes at least one of: an indium aluminum gallium phosphide (InAlGaP) material, a gallium nitride (GaN) material, a gallium arsenide (GaAs) material, or a gallium phosphide (GaP) material.

In some aspects, the mesa has a circular base or a square base.

In one example, a method is provided. The method comprises: forming an epitaxial structure having a light emitting layer on a substrate; forming an electrical contact on the epitaxial structure, the electrical contact being formed over a center of the light emitting layer; depositing a photoresist material over the electrical contact and the epitaxial structure; heating the photoresist material and the epitaxial structure to form a parabolic photoresist overlapping with the electrical contact; etching the epitaxial structure using the photoresist material to create a parabolic mesa having a protrusion region between the electrical contact and the light emitting layer; and forming an light emitting diode (LED) device comprising the parabolic mesa and the protrusion region having the electrical contact on the epitaxial structure as a result of the etching.

BRIEF DESCRIPTION OF THE DRAWINGS

Illustrative embodiments are described with reference to the following figures.

Figure 1A:
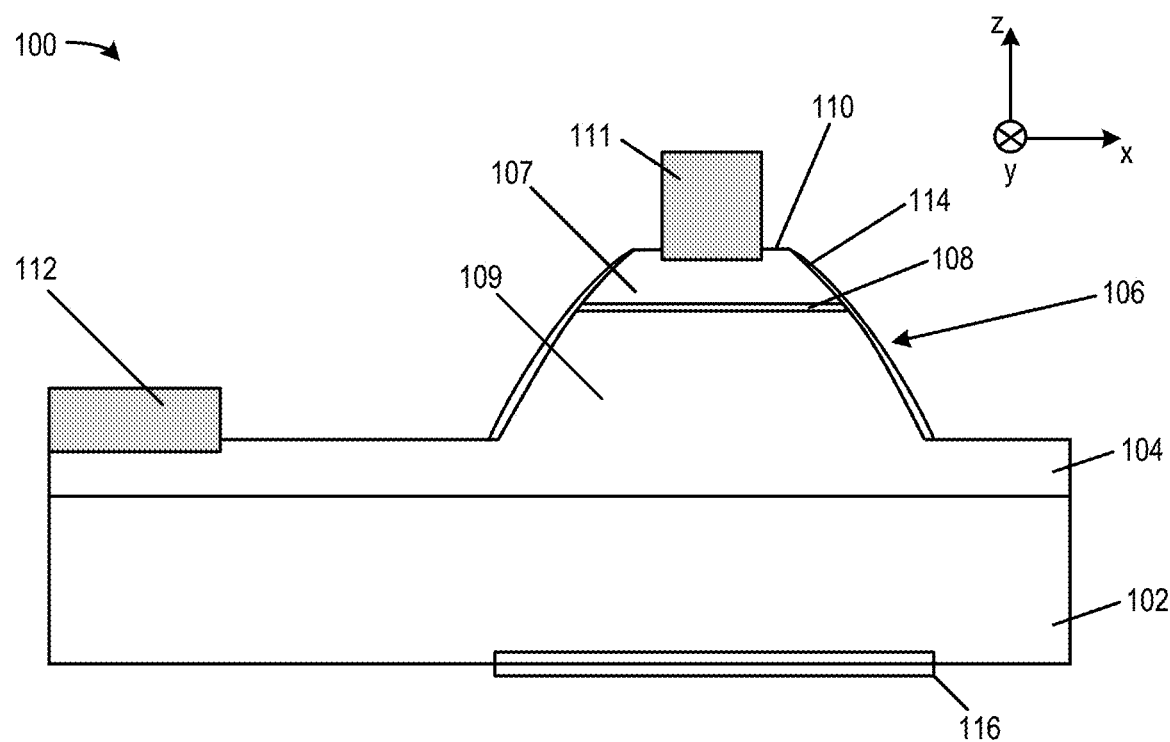
FIG. 1A and FIG. 1B illustrate an example LED device.

The figures depict examples of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "μLED," or "MicroLED," described herein, refers to a particular type of ILED having a small active light emitting area (e.g., less than 2,000 $\mu m^2$) and, in some examples, being capable of generating directional light to increase the brightness level of light emitted from the small active light emitting area.

ILED displays can be manufactured using different processes from OLED displays. For example, OLED devices are fabricated directly onto a display substrate. In contrast, ILED devices are fabricated separately from the display substrate. The base material of ILED devices is grown on a crystalline substrate to form an LED starter wafer. The LED starter wafer can be processed through various steps to produce individual LED dies, with each LED die including an LED device. Once fabricated, the LED dies can be transferred from the carrier substrate to a backplane. The backplane can be a display backplane of a display device, which may include a flexible substrate such as polymers, or a rigid substrate such as Thin Film Transistor (TFT) glass substrate. As part of the transfer process, the LED dies can also be assembled to form a display element which corresponds to a pixel or a sub-pixel of a display. A final display may comprise one or more display elements.

The light output by the LED devices may diverge and radiate along different directions. When the LED devices are used to display an image, the divergent light may cause blurring of the image as perceived by a viewer. The LED devices also need to be spaced out more to reduce the interference between the divergent light output by neighboring LED devices. The spacing requirement can limit the number of LED devices that can be included in a display, which in turn limits the achievable display resolution.

To improve the display quality and to increase the achievable display resolution, the LED devices of a display can be configured to generate collimated light towards a pre-determined direction (e.g., directly in front of the display). For example, a μLED device may include an internal light emitting layer (e.g., a layer having quantum wells) within the device that can emit light. The μLED device may also include an internal parabolic reflective surface having a focal point. The light emitting layer can be positioned at the focal point of the internal parabolic reflective surface. A reflection-based collimation of light can be performed, in which the light generated by part of the light emitting layer at the focal point can be reflected by the parabolic reflective surface to form parallel light rays. An array of μLED devices can output the parallel light rays as collimated light to display an image. The collimated light can propagate towards a pre-determined direction (e.g., directly in front of the display) with reduced or no divergence, which reduces the blurring of the perceived image. The outputting of parallel light rays can also reduce interference between the light output by neighboring LED devices, which can reduce the spacing requirement between neighboring LED devices and allow more LED devices to be included in a display. As a result, the display quality, as well as the achievable display resolution, can be improved.

Although the aforementioned reflection-based light collimation can reduce the divergence of the light output by the μLED devices, the divergence effect may remain for much of the output light. This is because the parabolic surface only reflects light generated at the focal point as collimated light. For light generated at other parts of the light emitting layer not at the focal point, the parabolic reflective surface does not reflect the light as collimated light. The μLED device may output a mixture of collimated light as well as non-collimated and divergent light, with the intensity of non-collimated and divergent light similar to or even higher than the intensity of the collimated light. As a result, considerable blurring and interference due to the divergent output light may remain.

The present disclosure proposes an LED device, such as a μLED device, that includes an electrical contact and an epitaxial structure having a mesa shape. The epitaxial structure may include a first doped semiconductor layer, a second doped semiconductor layer, and a quantum well layer between the first doped semiconductor layer and the second doped semiconductor layer. The electrical contact is formed on the first doped semiconductor layer. The first doped semiconductor layer further comprises a depression region surrounding the electrical contact. The depression region is configured to restrict charge travel paths within the first doped semiconductor layer, to facilitate charges travelling from the electrical contact through the first semiconductor layer to a limited region of the quantum well layer. The charges can recombine with charges from the second doped semiconductor layer at the limited region. The recombination can cause the quantum well layer at the limited region to generate light. The mesa further includes a parabolic reflective surface having a focal point positioned at the limited region of the quantum well layer to reflect light generated by the limited region as collimated light.

With the disclosed LED device structure, most of the charge recombination can occur at the limited region of the quantum well layer compared with other parts of the quantum well layer. This allows the quantum well layer to be operated effectively as a high-intensity point source of light located at the focal point of the parabolic reflective surface. As a result, a higher intensity of light can be reflected as collimated light by the parabolic reflective surface. Such arrangements can increase the intensity of collimated light and reduce the intensity of non-collimated and divergent light output by the LED device. As a result, the blurring and interference due to divergent output light can be reduced, and the display quality as well as the display resolution can be improved.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers. Examples of the present disclosure may be used to implement, for example, a display system in an HMD, a mobile device, a computing system, or any other hardware platform capable of providing artificial reality content to one or more viewers.

Figure 1B:
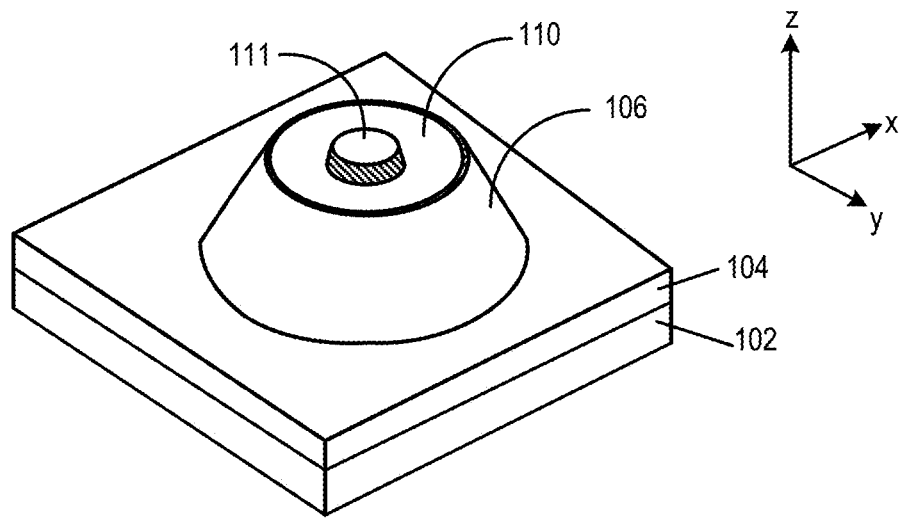

FIG. 1A and FIG. 1B illustrate a µLED 100 according to some examples of the present disclosure. FIG. 1A shows a cross-sectional view of µLED 100, while FIG. 1B shows a perspective view of µLED 100. As shown in FIG. 1A and FIG. 1B, µLED 100 includes, among others, a substrate 102 and a semiconductor epitaxial structure 104 disposed on the substrate 102. Epitaxial structure 104 can be shaped into a mesa 106. Within mesa 106, epitaxial structure 104 can include a first semiconductor layer 107, a light emitting layer 108, and a second semiconductor layer 109. First semiconductor layer 107 can include first charge carriers of a first polarity, whereas second semiconductor layer 109 can include second charge carriers of a second polarity opposite to the first polarity. In the example of FIG. 1A and FIG. 1B, first semiconductor layer 107 can be of P-type, whereas second semiconductor layer 109 can be of N-type. Light emitting layer 108 can include quantum well structures where the first charge carriers and second charge carriers can recombine and release energy. The quantum well structures can emit light of a pre-determined wavelength range based on a quantity of the energy released by the combination.

As shown in FIG. 1A and FIG. 1B, mesa 106 also has a truncated top 110 which can include a P-contact pad 111, whereas a part of epitaxial structure 104 outside of mesa 106 may be covered by an N-contact pad 112. Both P-contact pad 111 and N-contact pad 112 can include metallic material. As to be discussed in more details below, an electrical signal can be applied across P-contact pad 111 and N-contact pad 112 to cause light emitting layer 108 to emit light. Moreover, mesa 106 also has a near-parabolic shape to form an internal reflective surface 114, which can reflect the light generated by light emitting layer 108 towards an output surface 116. The reflected light can exit µLED 100 via output surface 116 as output light. The near-parabolic structure of mesa 106 can be etched directly onto the LED die during the wafer processing steps. Mesa 106 for a typical µLED can have a diameter of about 50 micrometers (µm) or less, whereas each of P-contact pad 111 and N-contact pad 112 may have a diameter of about 20 µm. Although FIG. 1B shows that mesa 106 has a circular base, it is understood that mesa 106 can have a base of other shapes such as, for example, a square shape.

Figure 2A:
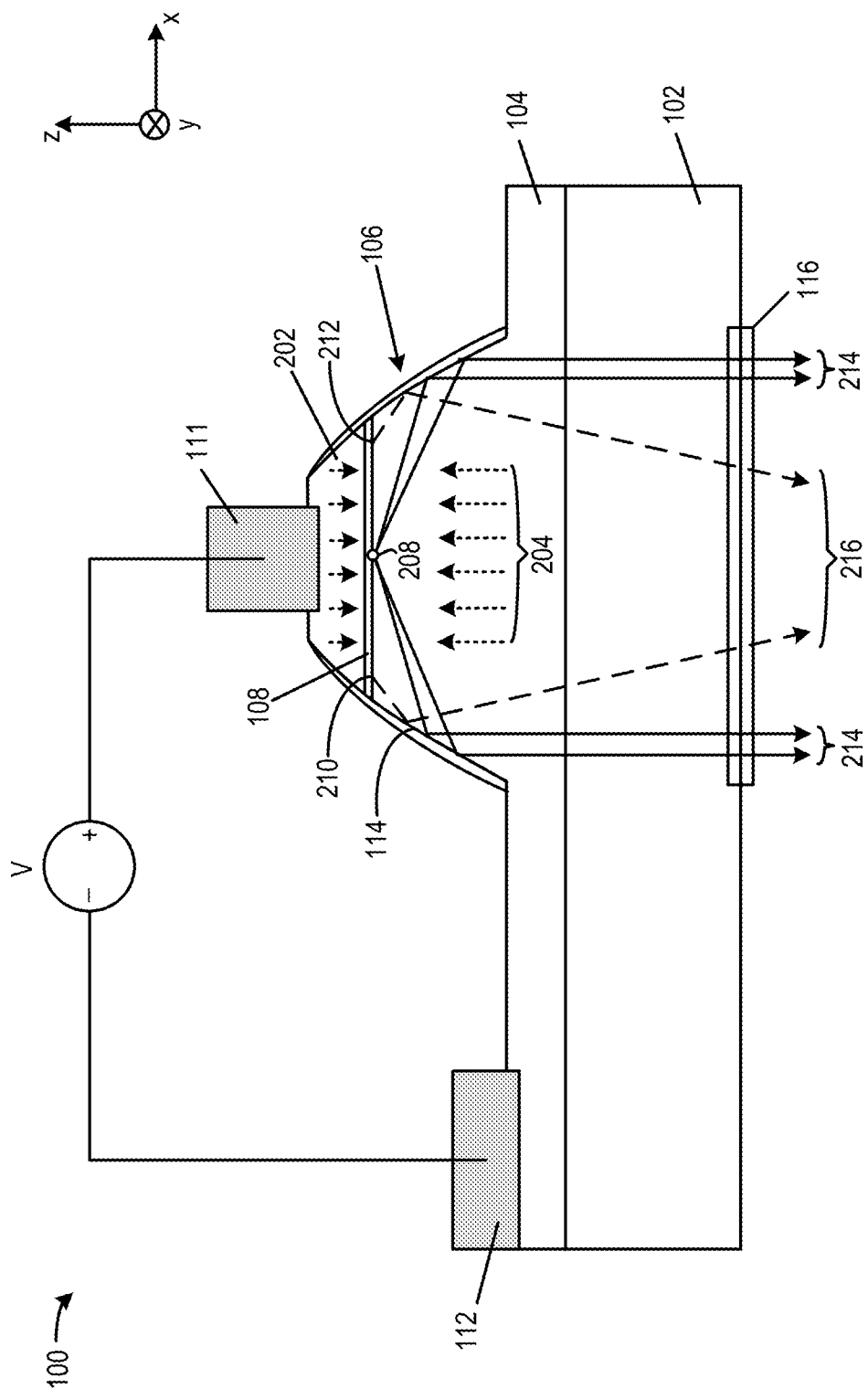
FIG. 2A, FIG. 2B, FIG. 2C, and FIG. 2D illustrate example operations of the LED device of FIG. 1A and FIG. 1B.
Figure 2B:
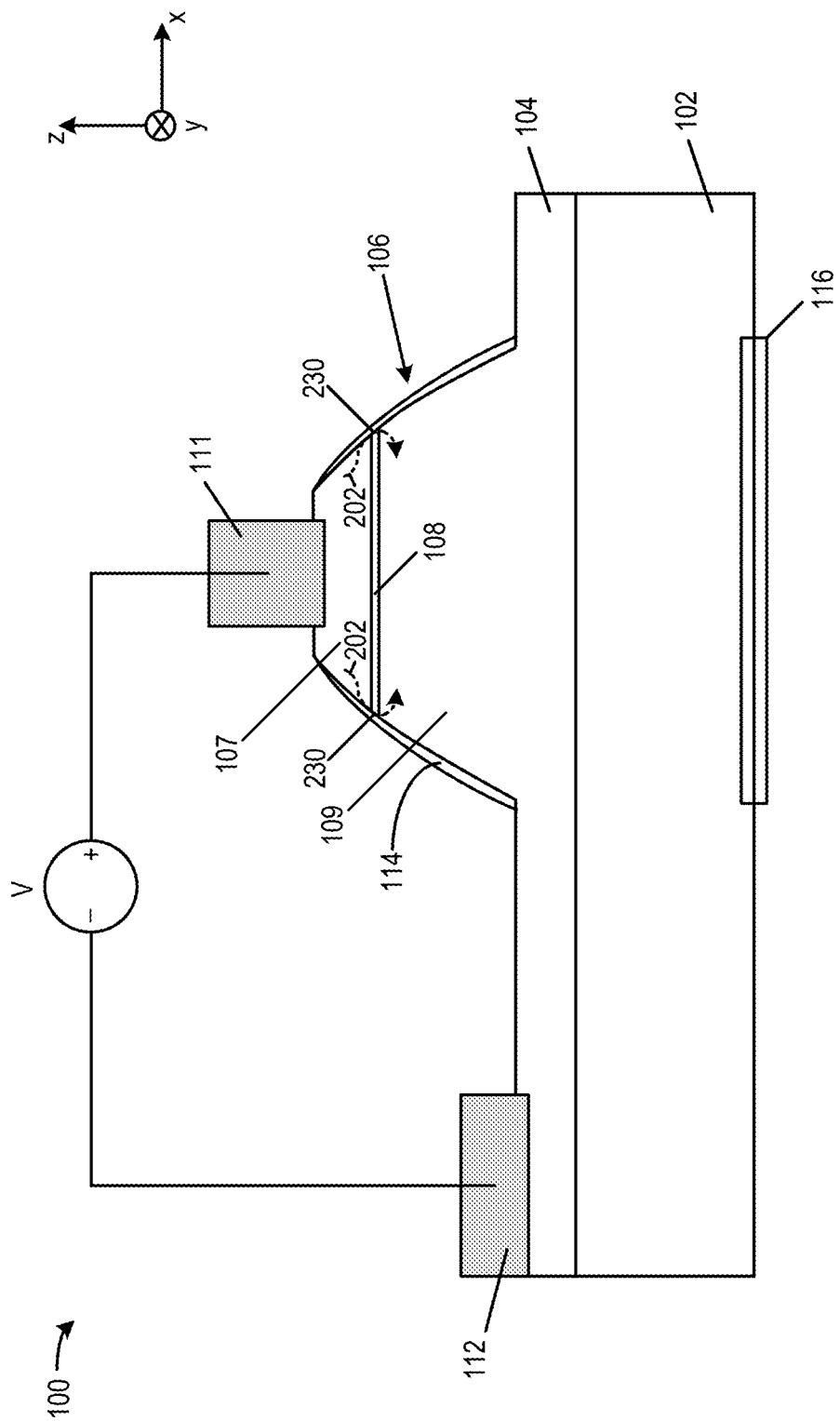

FIG. 2A and FIG. 2B show examples of operations of µLED 100. As shown in FIG. 2A, an electrical potential difference V can be applied across P-contact pad 111 and N-contact pad 112, with a positive potential (denoted as "+") applied to P-contact pad 111 and a negative potential (denoted as "−") applied to N-contact pad 112. The positive potential can cause P-type charge carriers 202 in first semiconductor layer 107 to move away from P-contact pad 111 and to move towards a first surface of light emitting layer 108 (e.g., a surface facing P-contact pad 111).

Moreover, the negative potential can cause the N-type charge carriers 204 in second semiconductor layer 109 to move away from N-contact pad 112 and to move towards a second surface of light emitting layer 108 opposite to the first surface. P-type charge carriers 202 and N-type charge carriers 204 can reach different locations of light emitting layer 109, and the charge carriers can be evenly distributed over the entireties of the first surface and of the second surface. P-type charge carriers 202 and N-type charge carriers 204 can recombine at different locations of light emitting layer 108, and light can be generated at the different recombination locations. Because of the relatively even distribution of P-type charge carriers 202 and N-type charge carriers 204 over the light emitting layer 109, the recombination (and light emission) locations can also be evenly distributed over light emitting layer 109. As a result, light emitting layer 109 can become a planar light source when activated by the potential difference. The generated light can be emitted on both the first surface and the second surface of light emitting layer 108 at multiple locations. For example, as shown in FIG. 2A, light can be emitted at locations 208, 210, and 212 of light emitting layer 108, with location 208 being collocated with the focal point of the near-parabolic internal reflective surface 114.

The light emitted at different locations of light emitting layer 108 can be reflected along different directions. For example, light emitted at location 208 can be reflected to form parallel light rays 214, whereas light emitted at locations 210 and 212 are reflected to form divergent light rays 216. In response to the applied electrical potential difference, µLED 100 can output a mixture of collimated light (e.g., including parallel light rays 214) and non-collimated light (e.g., including divergent light rays 216). Due to the relatively-even distributions of the carrier charges as well as recombination locations in light emitting layer 108, the intensity of the non-collimated light can be comparable to, or even exceed, the intensity of the collimated light, which can contribute to significant blurring to the perceived image as well as substantial interference of output light between neighboring µLEDs. Both the display quality and display resolution may be reduced as a result.

In addition to the generation of non-collimated light, the display quality provided by µLED 100 can be further degraded by other phenomena, such as charge leakage, in which some of P-type charge carriers 202 can bypass light emitting layer 108 and recombine with N-type charge carriers 204 within second semiconductor layer 109. Because of charge leakage, the quantity of charge carriers available for recombination at light emitting layer 108 reduces, which can decrease the intensity of light generated by light emitting layer 108 and output by μLED 100. FIG. 2B illustrates an example of charge leakage that can occur in μLED 100. As shown in FIG. 2B, some of P-type charge carriers 202 in first semiconductor layer 107 may leak along the interface 230 between internal reflective surface 114 and the perimeter of light emitting layer 108 to recombine with N-type charge carriers 204 in second semiconductor layer 109. Interface 230 may include crystal defects which can trap the P-type charge carriers 202 pushed away by the positive potential, and the trapped charges can move within the crystal defects to reach second semiconductor layer 109. The recombination of the leaked charge carriers does not contribute to the generation of light, and the quantity of charge carriers available for recombination at light emitting layer 108, as well as the intensity of light generated by light emitting layer 108, reduce as a result.

The generation of non-collimated light, as well as charge leakage, can be exacerbated by the low resistivity of epitaxial structure 104 (and first semiconductor layer 107), which can provide multiple electrical paths for P-type charge carriers 202 that have relatively uniform resistance. For example, referring to FIG. 2C, first semiconductor layer 107 may provide multiple electrical paths between a point within first semiconductor layer 107 (denoted as 'A') and different locations of light emitting layer 108 including, for example, electrical paths 250, 260, and 270. Electrical path 250 can include a vertical electrical path (e.g., parallel with the Z-axis) between point A and a center point of light emitting layer 108 (e.g., at location 208, which is co-located with the focal point of the near-parabolic internal reflective surface 114). Moreover, electrical paths 260 and 270 can include lateral electrical paths (e.g., parallel with the X or Y axis) between point A and a point near the perimeter of light emitting layer 108 (e.g., at interfaces 230 between internal reflective surface 114 and the perimeter of light emitting layer 108). The resistances of electrical paths 250, 260 and 270 can determine the relative quantities of P-type charge carriers 202 that travel through each of these electrical paths to reach the different locations of light emitting layer 108. For example, in a case where the resistance of electrical path 250 is much smaller than the resistances of electrical paths 260 and 270, a large majority of P-type charge carriers 202 can travel through electrical path 250 to reach the center point of light emitting layer 108. On the other hand, in a case where the resistance of electrical path 250 is similar to the resistances of electrical paths 260 and 270, P-type charge carriers 202 can be distributed evenly among the electrical paths.

The resistance of the electrical paths can be determined based on the following equation:

$$R = \rho \times \frac{L}{w \times h} \quad \text{(Equation 1)}$$

In Equation 1, R is the resistance, whereas p is the resistivity which is specific to the material that provides the electrical path. Moreover, the resistance is also determined based on a set of geometric parameters of the electrical path that can affect the flow of charges. The geometric parameters include, for example, length L of the electrical path. A longer length means the charges need to travel over a longer distance, and the resistance increases with the length. The geometric parameters also include the width w and height h of the cross-section of the electrical path that is perpendicular to the length of the electrical path. A larger width and/or height can lead to a larger cross-sectional area which allows more charges to move simultaneously, which also leads to a smaller resistance. A smaller width and/or height, on the other hand, reduces the cross-sectional area and increases the resistance.

Figure 2C:
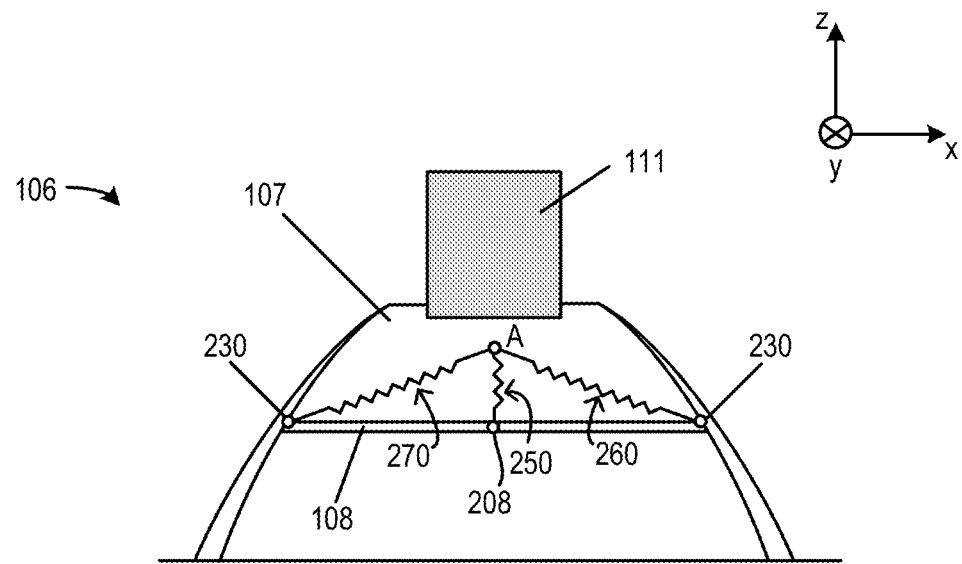
Figure 2D:
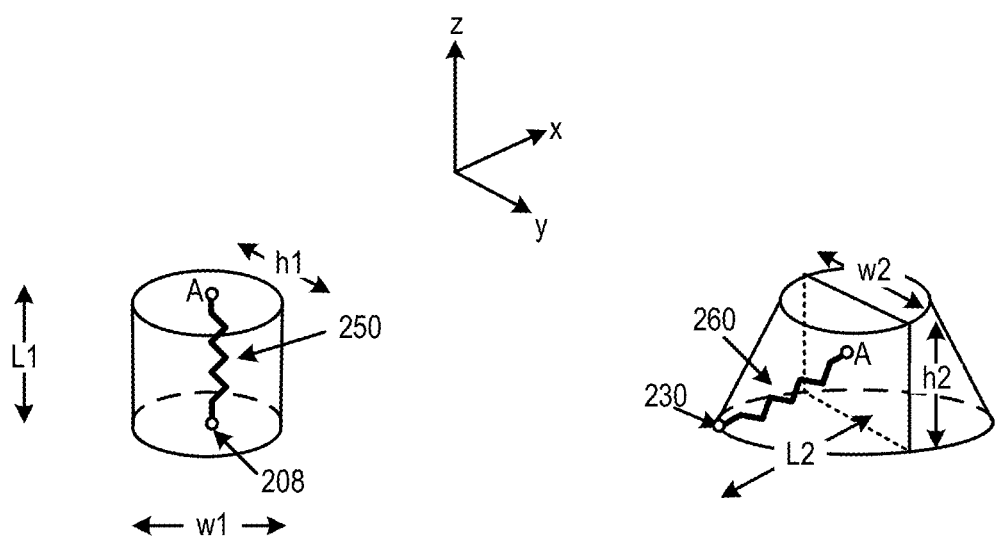

FIG. 2D illustrates examples of the geometric parameters of electrical paths 250 and 260. For example, as shown in FIG. 2D, the cross-section of electrical path 250 has a width of w1 and a height of h1 on the X-Y plane, whereas the length of electrical path 250 is L1 along the Z-axis. Also, the cross-section of electrical path 260 has a width of w2 and a height of h2 on the Y-Z plane, whereas the length of electrical path 260 is L2 along the X-axis. For simplicity, it is assumed that the weight w and height h are uniform along the length L for both electrical paths.

In Equation 1, the ratio between resistivity (ρ) and height (h) (or width (w)) can define the sheet resistance (Rs) of an electrical path. Sheet resistance can provide a measurement of a resistance that is specific to a dimension and the material of an electrical path. Equation 1 can be rewritten in terms of sheet resistance as follows:

$$R = \frac{\rho}{h} \times \frac{L}{w} = R_s \times \frac{L}{w} \quad \text{(Equation 2)}$$

In FIG. 2C and FIG. 2D, in a case where epitaxial structure 104 is made of materials having relatively low resistivity ρ, such as indium aluminum gallium phosphide (InAlGaP) materials and gallium arsenide (GaAs) materials for red LEDs, the resistance R and sheet resistance Rs of the electrical paths 250, 260, and 270 can be similar if the length L, width w, and height h are also similar for the electrical paths. As a result, the rate of flow of charge carriers on each of the electrical path can become similar, and a significant quantity of charge carriers can be involved in the generation of non-collimated light and charge leakage as a result. On the other hand, in a case where epitaxial structure 104 is made of materials having relatively high resistivity ρ, such as gallium nitride (GaN) materials for blue and green LEDs, the high resistivity can increase the difference in the resistances among electrical paths 250, 260, and 270. For example, the resistance of electrical path 250 can be much smaller than the resistances of electrical paths 260 and 270. As a result, a larger portion of P-type charge carriers 202 (compared with the case of red LED) can travel through electrical path 250 to reach the center point of light emitting layer 108, and a smaller portion of P-type charge carriers 202 is involved in the generation of non-collimated light and charge leakage. Due to the low resistivity in the epitaxial material, red LEDs can be much more susceptible to generation of non-collimated light and charge leakage than blue LEDs and green LEDs.

In the example of FIG. 2C and FIG. 2D, to reduce the rate of flow of charge carriers along electrical paths 260 and 270, μLED 100 can be constructed to increase the resistance of electrical paths 260 and 270 with respect to electrical path 250. For example, the sheet resistances (Rs) of electrical paths 260 and 270 can be increased with respect to electrical path 250, to enable more charges to travel through electrical path 250 to the center of light emitting layer 108.

Figure 3A:
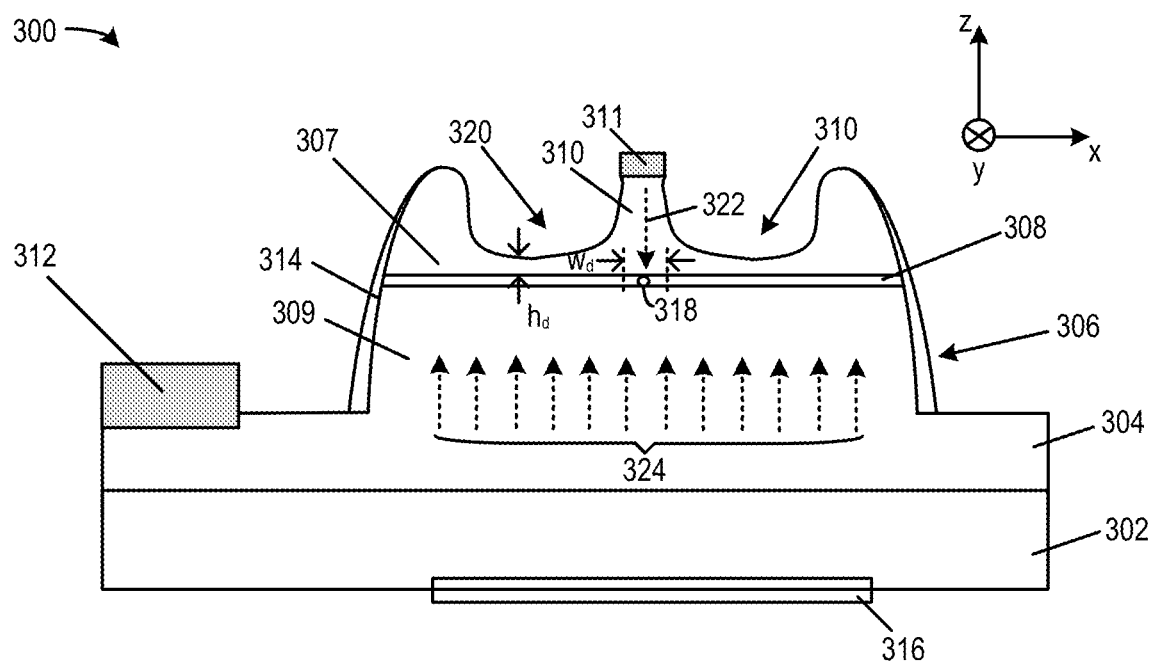
FIG. 3A, FIG. 3B, FIG. 3C, FIG. 3D, FIG. 3E, FIG. 3F, and FIG. 3G illustrate examples of LED devices to facilitate collimation of light, according to examples of the disclosed techniques.
Figure 3B:
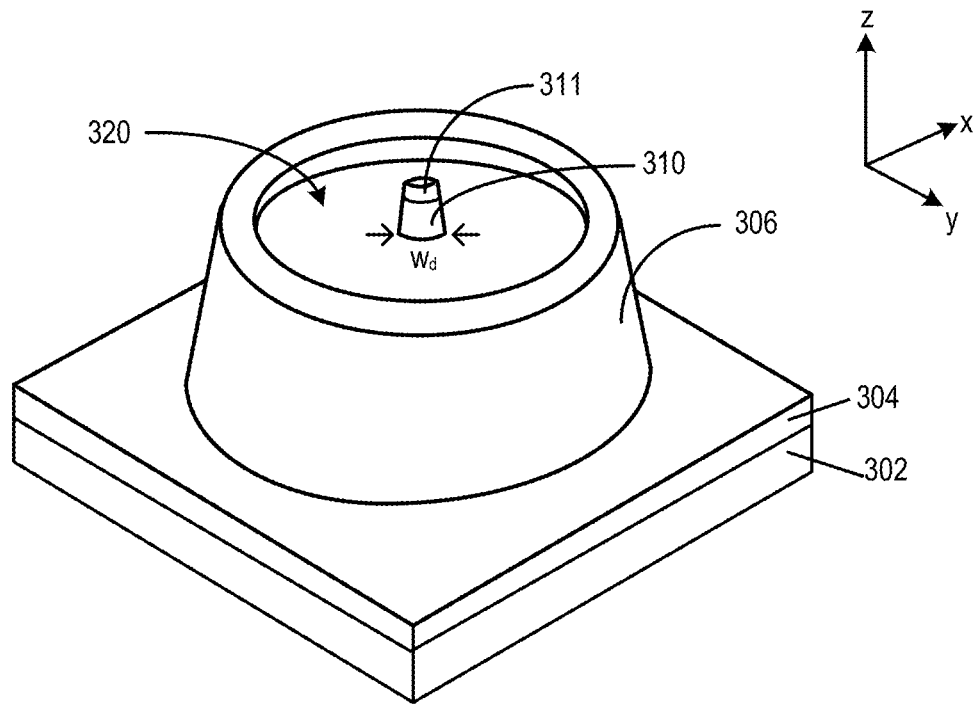

FIG. 3A and FIG. 3B illustrate an example of μLED 300 which is configured to facilitate movement of charge carriers to the center of a light emitting layer, according to examples of the disclosed techniques. FIG. 3A shows a cross-sectional view of μLED 300, while FIG. 3B shows a perspective view of μLED 300. As shown in FIG. 3A and FIG. 3B, μLED 300 includes, among others, a substrate 302 and a semiconductor epitaxial structure 304 disposed on the substrate 302. Substrate 302 and epitaxial structure 304 may comprise different types of materials, which can also vary depending on the desired light output frequency of the LED being produced. For example, for a blue or green LED, substrate 302 may comprise a sapphire or aluminum oxide ($Al_2O_3$) material, and the epitaxial structure 304 may comprise a gallium nitride (GaN) material. As another example, for a red LED, substrate 302 may comprise gallium arsenide (GaAs) material, an indium aluminum gallium phosphide (InAlGaP) material, etc., and epitaxial structure 304 may comprise an aluminum gallium arsenide (AlGaAs) material. Other types of materials may also be used.

Epitaxial structure 304 can include a mesa 306. Although FIG. 3B shows that mesa 306 has a circular base, it is understood that mesa 306 can have a base of other shapes. Within mesa 306, epitaxial structure 304 can include a first semiconductor layer 307, a light emitting layer 308, and a second semiconductor layer 309. First semiconductor layer 307 can include first charge carriers of a first polarity, whereas second semiconductor layer 309 can include second charge carriers of a second polarity opposite to the first polarity. In the example of FIG. 3A and FIG. 3B, first semiconductor layer 307 can be of P-type, whereas second semiconductor layer 309 can be of N-type. Light emitting layer 308 can be a quantum well layer, which can include quantum well structures where the first charge carriers and second charge carriers can recombine and release energy. The quantum well structures can emit light of a pre-determined wavelength range based on a quantity of the energy released by the combination. Light emitting layer 308 also has a center 318.

As shown in FIG. 3A and FIG. 3B, a protrusion region 310 can be formed on mesa 306. A P-contact pad 311 can be formed on protrusion region 310, whereas a part of epitaxial structure 304 outside of mesa 306 may be covered by an N-contact pad 312. Both P-contact pad 311 and N-contact pad 312 can include metallic material. A positive potential can be applied to P-contact pad 311 to push P-type charge carriers 322 towards a first surface of light emitting layer 308 (e.g., a surface facing P-contact pad 311). A negative potential can be applied to N-contact pad 312 to push N-type charge carriers 324 towards a second surface of light emitting layer 308 opposite to the first surface. The P-type charge carriers and the N-type charge carriers can recombine at light emitting layer 308, and the recombination can activate light emitting layer 308 to generate light. Mesa 306 also has a near-parabolic shape to form an internal reflective surface 314, which can reflect the light generated by light emitting layer 308 towards an output surface 316. The reflected light can exit μLED 300 via output surface 316 as output light. The focal point of near-parabolic internal reflective surface 314 can be co-located with center 318 of light emitting layer 308.

In addition, a depression region 320 can be formed on mesa 306. In some examples, depression region 320 can surround protrusion region 310 to form a trench or a moat structure. In some examples, multiple depression regions 320 can surround and fully enclose protrusion region 310 to form multiple trenches or moat structures. In some examples, multiple depression regions 320 can surround but not fully enclose protrusion region 310 to form disconnected trenches or moat structures. In some examples, As shown in FIG. 3A, depression region 320 can reduce the height (denoted as ha in FIG. 3A) of first semiconductor layer 307 along the Z-axis and can define a focus region of width $w_d$ around center 318 of light emitting layer 308. As to be discussed below, the reduced height can increase the overall resistance of lateral electrical paths (e.g., along the X-axis) from protrusion region 310 towards the perimeter of light emitting layer 308. The increase in the resistance of the lateral electrical paths can cause more P-type charge carriers 322 to flow towards center 318 and recombine at the focus region of light emitting layer 308. As a result, the intensity of light at the focal point of near-parabolic internal reflective surface 314 increases, and the intensity of collimated light generated from the reflection by near-parabolic internal reflective surface 314 increases as well.

Figure 3C:
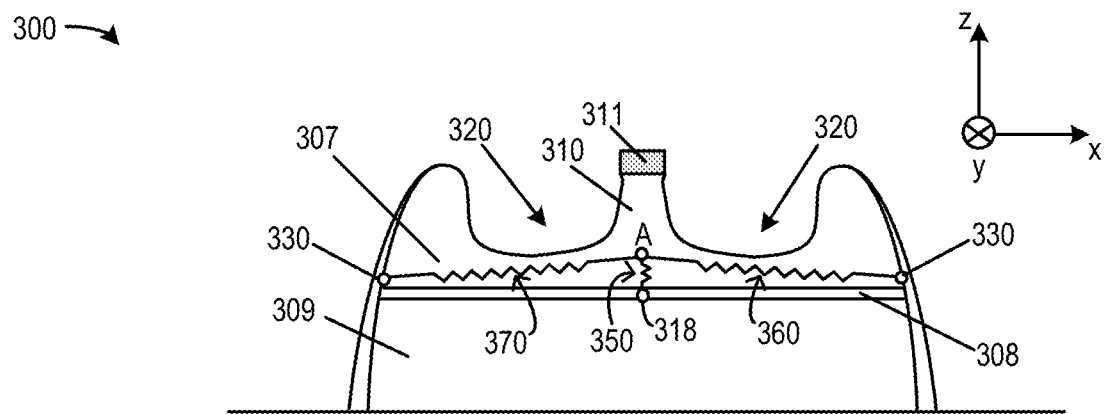
Figure 3D:
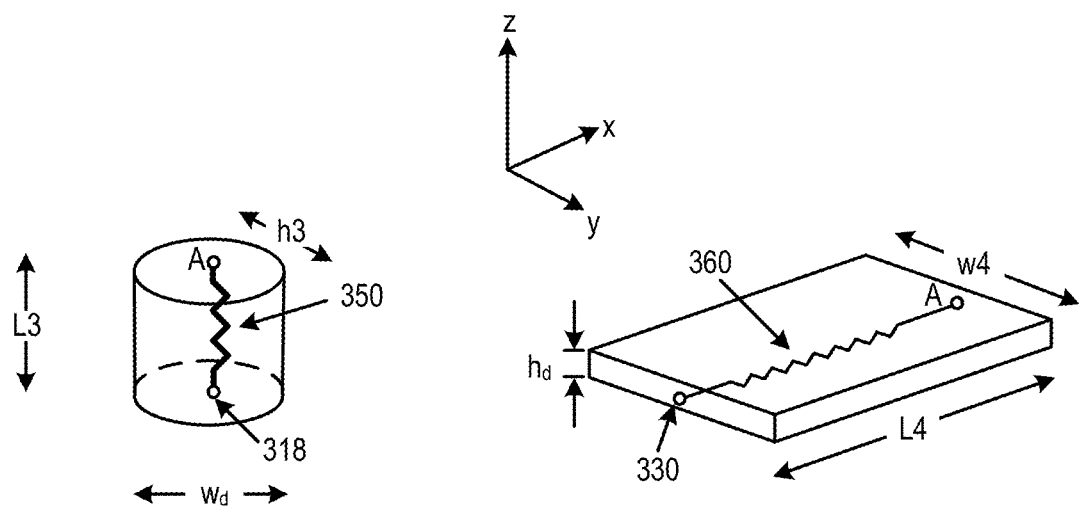

FIG. 3C and FIG. 3D illustrate an example of the effect of depression region 320 on the flow of P-type charge carriers 322. As shown in FIG. 3C, when P-type charge carriers 322 flow along protrusion region 310 and reach a point A, P-type charge carriers 322 can flow along multiple electrical paths to reach different locations of light emitting layer 308. The multiple electrical paths may include, for example, electrical paths 350, 360, and 370. Electrical path 350 can include a vertical electrical path (e.g., parallel with the Z-axis) between point A and center 318 of light emitting layer 308. Moreover, electrical paths 360 and 370 can include lateral electrical paths (e.g., parallel with the X or Y axis) between point A and a point near the perimeter of light emitting layer 308 (e.g., at interfaces 330 between internal reflective surface 314 and the perimeter of light emitting layer 308).

Depression region 320 can define some of the geometric parameters of electrical paths 350 and 360 (and 370), which in turn can define the resistances of the electrical paths. For example, referring to FIG. 3D, the cross-section of electrical path 350 can be identical to the focus region of light emitting layer 308, and can have a width $w_d$ defined by depression region 320, and a height h3 which can also be defined by depression region 320. Electrical path 350 also has a length L3. Moreover, the cross section of electrical path 360 has a height hd defined by depression region 320, a width w4 (which can be identical to the width of mesa 306), and a length L4. The resistances of electrical paths 350 and 360 can be determined based on Equation 1 as follows:

$$R_{350} = \frac{\rho}{h3} \times \frac{wd}{h3} = R_{s,350} \times \frac{wd}{h3} \qquad \text{(Equation 3)}$$

$$R_{360} = \frac{\rho}{hd} \times \frac{L4}{w4} = R_{s,360} \times \frac{L4}{w4} \qquad \text{(Equation 4)}$$

In Equations 3 and 4, $R_{350}$ is the resistance of electrical path 350, whereas $R_{360}$ is the resistance of electrical path 360. The resistances of electrical paths 350 and 360 are determined by the same resistivity ρ given that they are both part of first semiconductor layer 307. Moreover, depression region 320 reduces the height hd and increases the sheet resistance $R_{s,360}$ of electrical path 360 relative to the sheet resistance $R_{s,350}$ of electrical path 350. Assuming that electrical paths 350 and 360 have similar values for other geometric parameters, the formation of depression region 320 in first semiconductor layer 307 can increase the resistance of electrical path 360 relative to the resistance of electrical path 350. As a result, P-type charge carriers 322 can flow at a higher rate along electrical path 350 to the focus region around center 318 of light emitting layer 308 to recombine with N-type charge carriers 324, while the rate of flow of P-type charge carriers 322 along electrical paths 360 and 370 away from the focus region can be reduced. The quantity of charge carriers lost to charge leakage and/or involved in generation of non-collimated light can be reduced as a result.

Figure 3E:
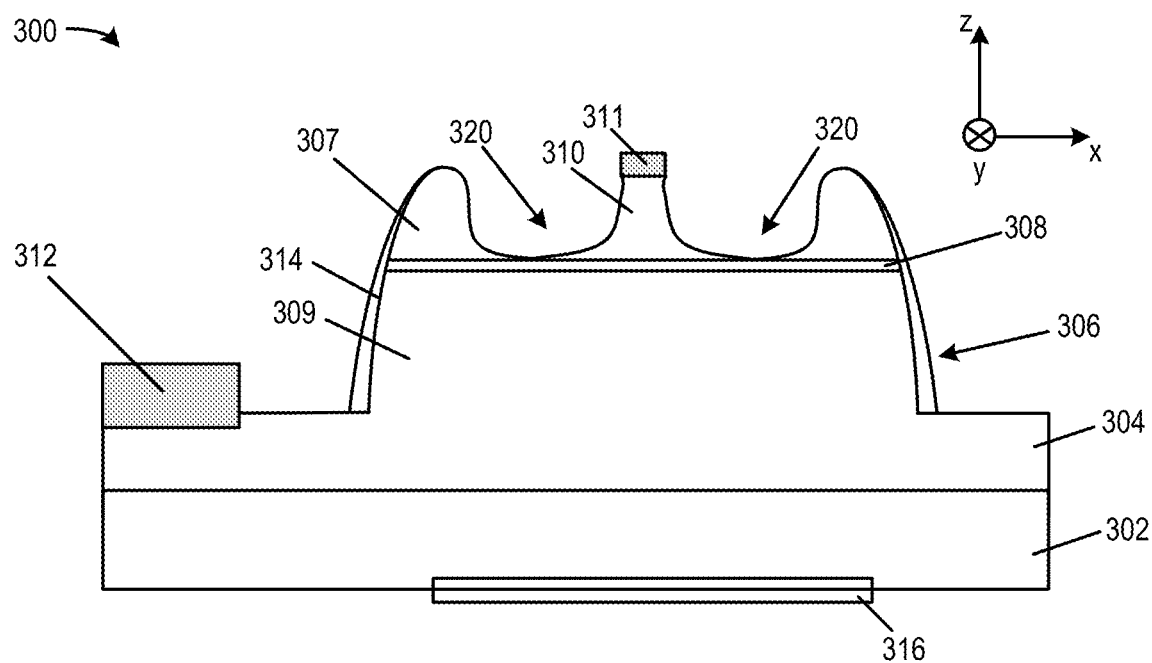
Figure 3F:
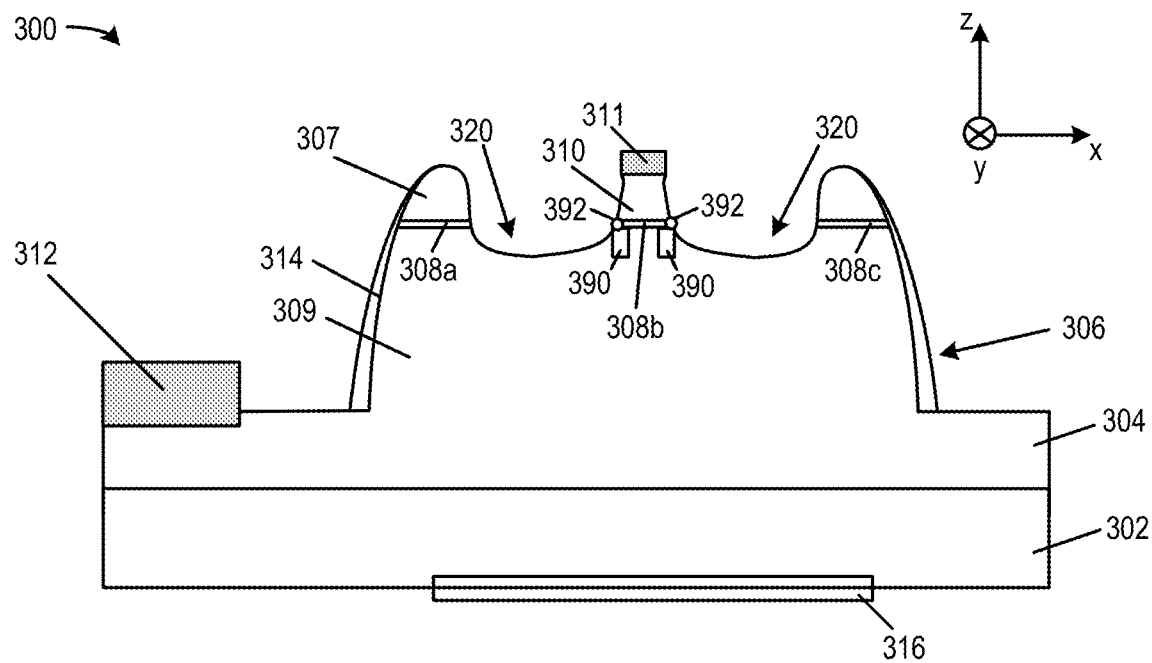

FIG. 3E and FIG. 3F illustrate additional examples of μLED device 300. In the example shown in FIG. 3E, depression region 320 can be configured such that it touches light emitting layer 308. Also, in the example shown in FIG. 3F, depression region 320 can be configured such that it intersects with light emitting layer 308 and divides light emitting layer 308 into several regions including, for example, regions 308a, 308b, and 308c, such that only region 308b (at a center of μLED device 300 on the X-Y plane) will receive P-type charge carriers 322 and emit light. In the example of FIG. 3F, a charge stopping layer 390 (e.g., a P-type semiconductor material) can be formed below interface 392 between depression region 320 and region 308b. The charge stopping layer can be formed by, for example, an ion implantation process, a lateral oxidation process, etc. The charge stopping layer can be configured to prevent P-type charge carriers 322 from leaking through interface 392 into second semiconductor layer 309 without recombination at region 308b. In some examples, charge stopping layer 390 can be a P-type semiconductor material or have the same charge polarity as first semiconductor layer 307 (and protrusion region 310).

Moreover, although FIG. 3A-FIG. 3F illustrate that depression region 320 includes curved sidewalls and curved bottoms, it is understood that depression region 320 can take on other shapes such as, for example, having vertical sidewalls (e.g., parallel with the Z-axis) and/or flat bottoms (e.g., parallel with the X or Y axis). Moreover, more than one depression region can also be formed in first semiconductor layer 307. For example, instead of configuring depression region to include a single trench structure surrounding protrusion region 310, depression region 320 may include multiple co-centric trench structures surrounding protrusion region 310.

Figure 3G:
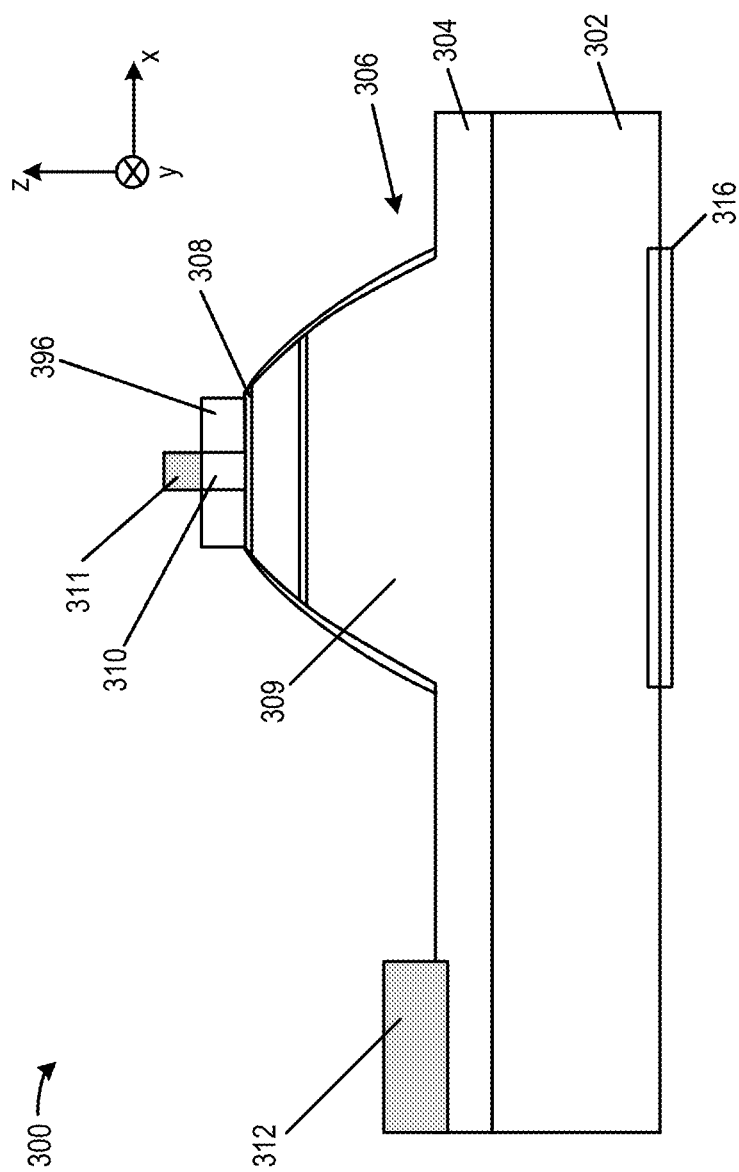

FIG. 3G illustrates additional example of μLED device 300. In the example of FIG. 3G, protrusion region 310 is formed on mesa 306 to provide a narrow electrical path between P-contact pad 311 and a center (along the X and Y axes) of light emitting layer 308. First semiconductor layer 307 can be shaped into a narrow column to form protrusion region 310. Optionally, mesa 306 may further include an insulation layer 396 surrounding protrusion region 310 and extending to the perimeter of light emitting layer 308, to insulate protrusion region 310 and to prevent charge from leaking away from protrusion region 310. Insulation layer 396 may include a silicon oxide material (SiOx), a silicon nitride material (SiNx), a polymer such as Benzocyclobutene (BCB), etc. With the arrangements of FIG. 3G, the electrical path 370 (along the X and Y axes) from above the center of light emitting layer 308 towards the perimeter of light emitting layer 308 can be largely eliminated. As a result, charge carriers in μLED device 300 can be forced to flow towards the center of light emitting layer 308 via the narrow electrical path provided by protrusion region 310 and recombine at the center.

With the techniques described in FIG. 3A-FIG. 3G, the resistance of electrical paths that lead the charge carriers away from the center of the light emitting layer can be increased. As a result, more charge carriers in a μLED device can be induced to flow towards the center the light emitting layer and recombine at the center, and a high-intensity point source of light may be formed as a result. If the point source of light is also aligned with the focal point of a parabolic internal reflective surface, the intensity of collimated light generated by the reflection of the parabolic internal reflective surface may increase as well.

The disclosed techniques are especially useful in improving the collimation of light in red μLED devices. As described above, the epitaxial structure of red μLED devices is typically made of materials having low resistivity, such that the charge carriers tend to move to different locations of the light emitting layer. With the disclosed techniques, despite the low resistivity, the resistance of the electrical paths towards the perimeter of the light emitting layer in a red μLED device can be made much larger than the resistance of the electrical path towards the center of the light emitting layer. The difference in the resistances can induce more charge carriers to flow towards the center the light emitting layer and recombine at the center, to create a high-intensity point source of light and to improve the collimation of output light.

By increasing the intensity of collimated light (relative to non-collimated light) generated by the μLED devices, display quality can be improved (e.g., by reducing blurring of perceived image), whereas achievable display resolution may also increase (e.g., by allowing LED devices to be more closely placed together with little or negligible interference between adjacent LED devices). The performance of the display as well as user experience can be improved as well.

Figure 4:
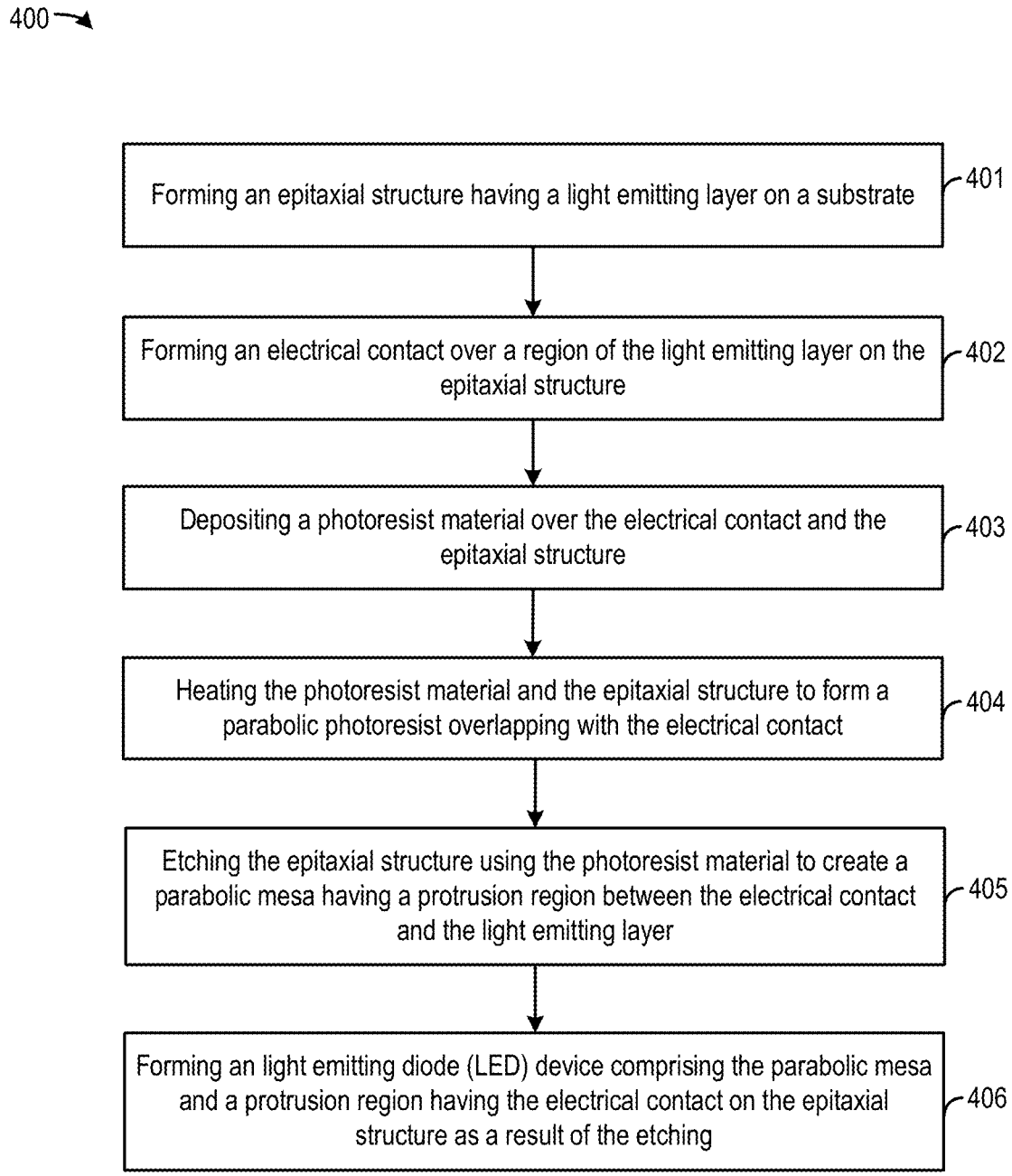
FIG. 4 illustrates an example process of fabricating an LED device, according to examples of the disclosed techniques.
Figure 5A:
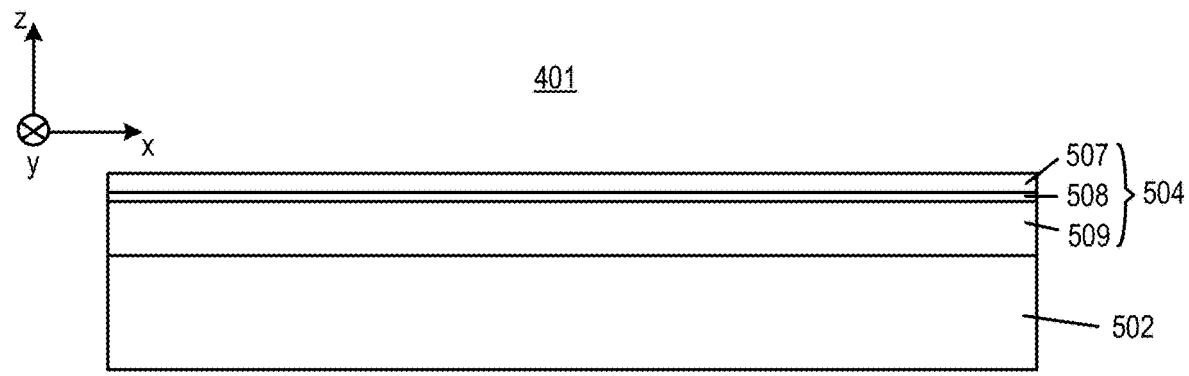
FIG. 5A, FIG. 5B, and FIG. 5C are schematic views illustrating the example process of FIG. 4.
Figure 5A:
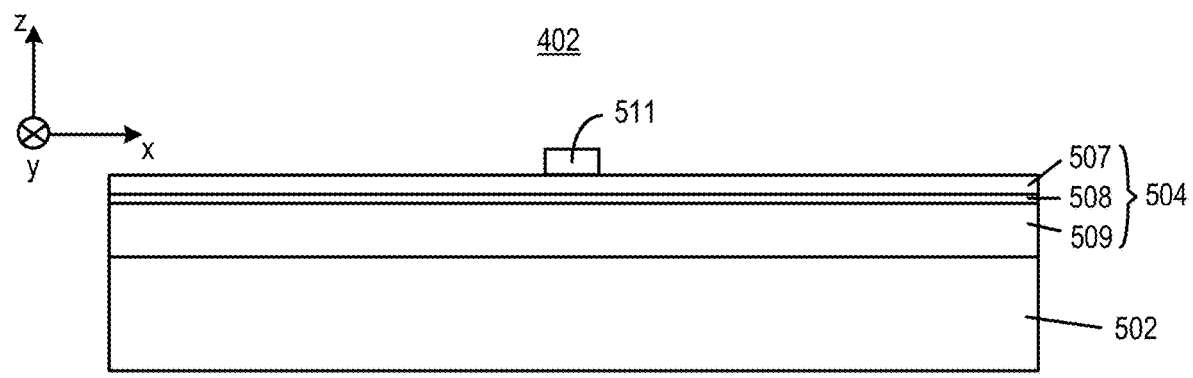
Figure 5A:
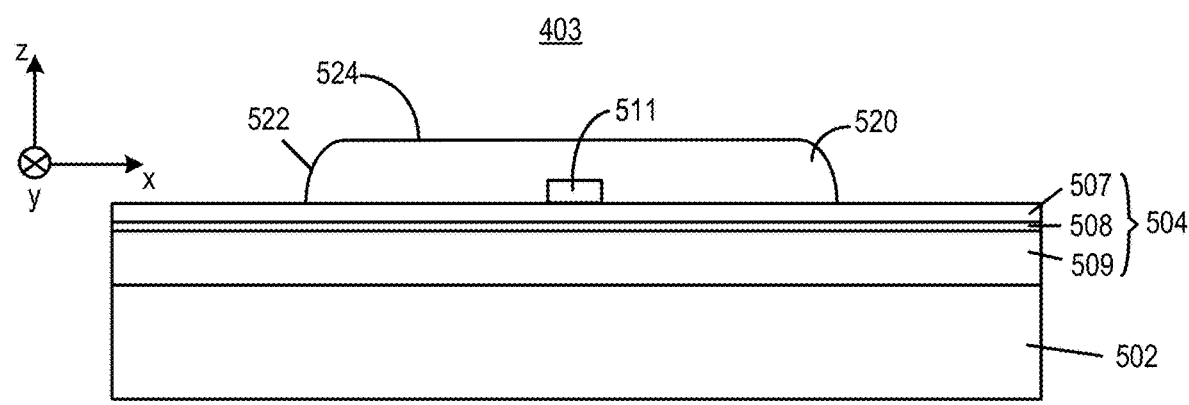
Figure 5B:
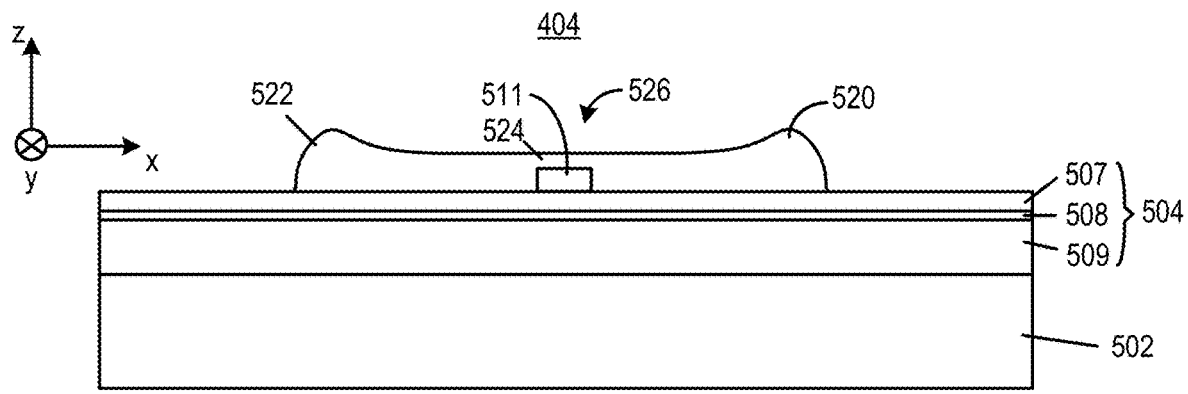
Figure 5B:
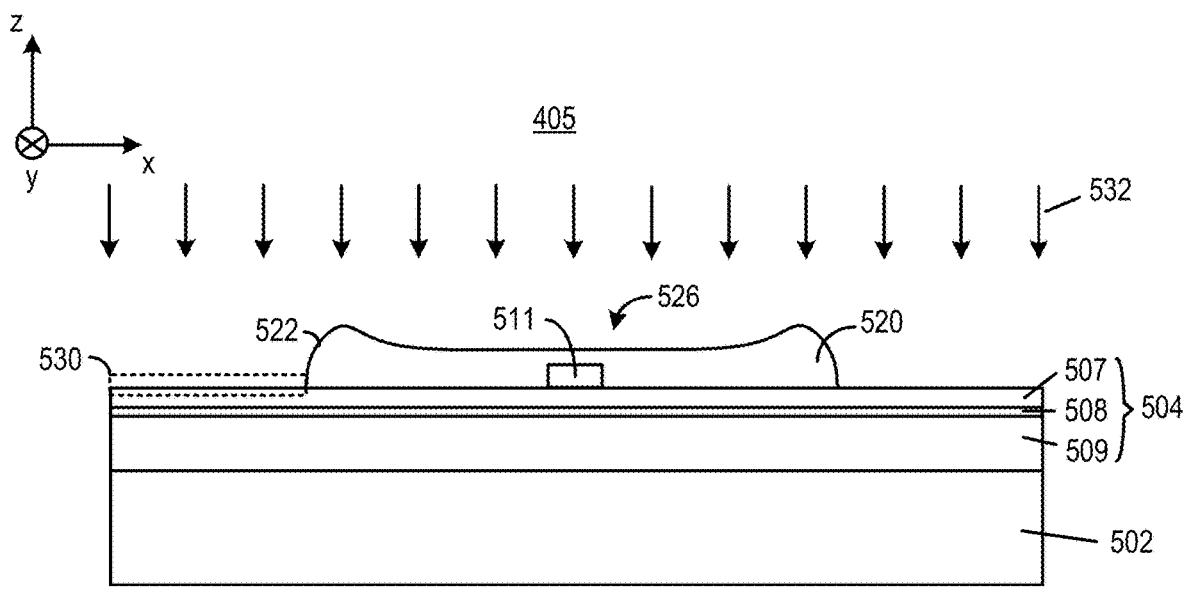
Figure 5C:
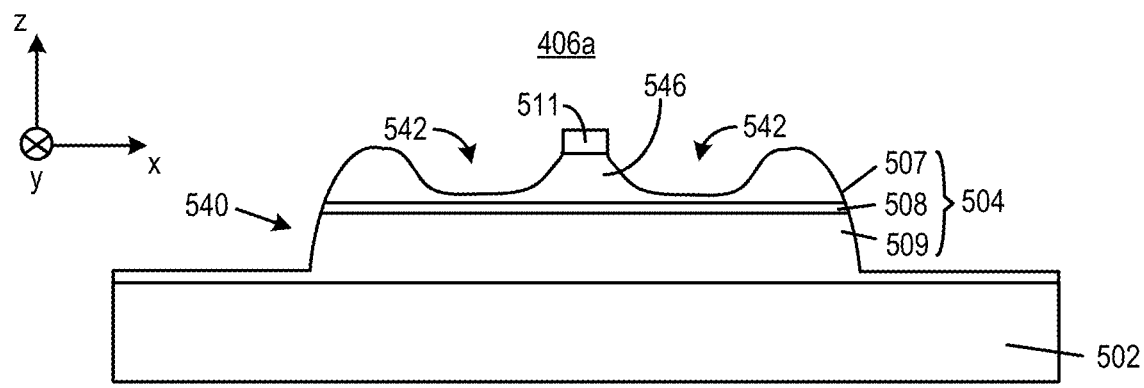
Figure 5C:
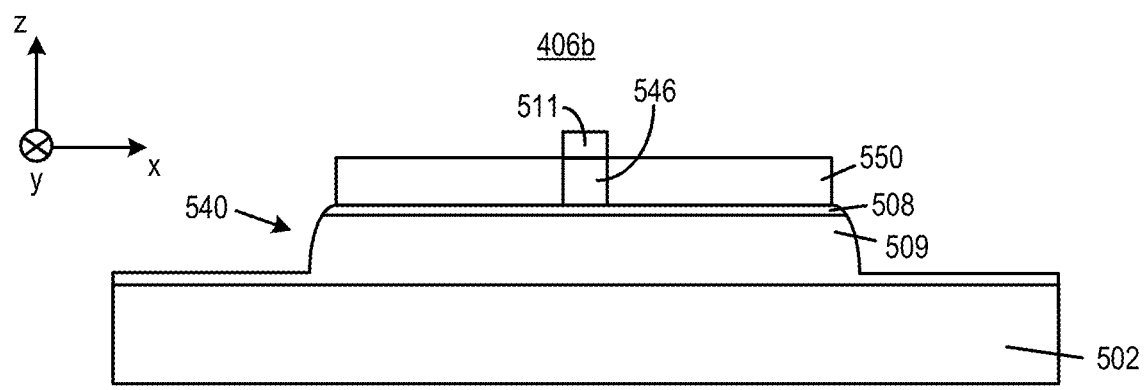

Reference is now made to FIG. 4, FIG. 5A, FIG. 5B, and FIG. 5C, which illustrate an example of process 400 for manufacturing and assembling LED devices. FIG. 4 is a flowchart that illustrates examples of the steps of process 400, whereas FIG. 5A, FIG. 5B, and FIG. 5C illustrate side views of the components involved in process 400. Process 400 can be used to manufacture, for example, μLED device 300 of FIG. 3A-FIG. 3G. It is understood that process 400 can be used to assemble different types of LED devices and is not limited to μLED devices.

Process 400 starts with step 401, which comprises forming an epitaxial structure having a light emitting layer on a substrate. For example, referring to FIG. 5A, an epitaxial structure 504 can be grown on a starter substrate 502. Epitaxial structure 504 may include a first semiconductor layer 507, a light emitting layer 508, and a second semiconductor layer 509. Epitaxial structure 504 may be grown using techniques such as Molecular Beam Epitaxy (MBE) or Metalorganic Chemical Vapor Deposition (MOCVD).

Starter substrate 502 and epitaxial structure 504 may comprise different types of materials, which can also vary depending on the desired light output frequency of the LED being produced. For example, for a blue or green LED, the starter substrate 502 may comprise a sapphire or aluminum oxide ($Al_2O_3$) material, and epitaxial structure 504 may comprise a gallium nitride (GaN) material. As another example, for a red LED, the starter substrate 502 may comprise opaque (or having low light transmittance) indium aluminum gallium phosphide (InAlGaP) materials and gallium arsenide (GaAs) materials, and epitaxial structure 504 may comprise an aluminum gallium arsenide (AlGaAs) material. Other types of materials may also be used. First semiconductor layer 507 and second semiconductor layer 509 can be formed by doping epitaxial structure 504 at different depths (e.g., along the Z-axis) using different dopants, such that first semiconductor layer 507 and second semiconductor layer 509 have charge carriers of opposite polarity. For example, first semiconductor layer 507 can be P-type InAlGaAs (for red LED) or P-type GaN (for blue or green LED), whereas second semiconductor layer 509 can be N-type AlGaAs (for red LED) or N-type GaN (for blue or green LED).

In step 402, an electrical contact is formed over a region of the light emitting layer on the epitaxial structure. A center of the region can be located at, for example, a center of the light emitting layer. Referring to FIG. 5A, a p-contact pad 511 can be formed on epitaxial structure 504. P-contact pad 511 can be a metallic material deposited on epitaxial structure 504 to define the location of a mesa portion to be formed in subsequent steps. As discussed in greater detail below, the p-contact pad 511 can provide a hard mask for etching the epitaxial structure 504 to form a mesa structure and a protrusion region on the mesa structure.

In step 403, a photoresist material is deposited over the contact and the epitaxial structure. For example, referring to FIG. 5A, a photoresist material 520 can be formed over p-contact pad 511 and part of epitaxial structure 504. Photoresist material 520 can provide a photoresist mask for etching first semiconductor layer 507, light emitting layer 508, and second semiconductor layer 509 to form the mesa structure. For example, the curvature of side surface 522 of photoresist material 520 can define the near-parabolic shape of the mesa, while top surface 524 of photoresist material 520 can define the footprint of the mesa.

In step 404, the photoresist material and the epitaxial structure can be heated to form a parabolic photoresist overlapping with the electrical contact. For example, referring to FIG. 5B, photoresist material 520 and epitaxial structure 504 can be heated together. In some examples, the heating can create or harden the curvature of side surface 522 of photoresist material 520 to define the mesa. The hardening can be due to the evaporation of the solvent containing the photoresist near the surface, which can lead to cross-linking/polymerization of the photoresist near the surface. In some examples, the heating can also form a depression region. The depression region 526 can be formed due to various reasons. For example, during the heating the bulk of the photoresist is in fluid form and tends to spread, but the spread of the liquid photoresist is restricted by the hardened photoresist near side surface 522. As the liquid photoresist flows away from the center and stopped by the hardened photoresist near side surface 522, depression region 526 may be formed. As another example, depression region 526 can be formed or contributed by uneven thermal expansion between photoresist material 520 and epitaxial structure 504.

In step 405, the epitaxial structure is etched using the photoresist material having the depression region as a mask. Referring to FIG. 5B, photoresist material 520 can act as a sacrificial layer to selectively delay the timing of etching of epitaxial structure 504. For example, photoresist material 520 as well as region 530 of epitaxial structure 504 not covered by photoresist material 520 are exposed to an etching agent 532. The etching agent can etch photoresist material 520 and region 530 simultaneously at pre-determined etch rates. The thickness of the photoresist material 520, as well as the etch rates, can determine how deep the etching agent penetrates into first semiconductor layer 507 within an etching time period, and the curvature of photoresist material 520 allows a mesa to be formed from etching.

Moreover, due to the reduced thickness of the depression region 526 of photoresist material 520, the etching agent can penetrate deeper into the portion of first semiconductor layer 507 underneath depression region 526 than, for example, the portion of first semiconductor layer 507 under side surface 522, and a depression region can be formed on first semiconductor layer 507. Further, P-contact pad 511 can form a mask to shield the portion of first semiconductor layer 507 underneath the contact pad from the etching agent, and a protrusion region remains while the portion of first semiconductor layer 507 underneath depression region 526 is etched away. The etching rates of photoresist material 520 and region 530 can be pre-determined based on a target profile (e.g., a target mesa height, a target depression region depth, etc.). The etching can be performed by, for example, a dry etching process, such as an inductively coupled plasma (ICP) etch. The ICP etch may be used to provide controllable isotropic or anisotropic etching. The ICP etch may include a combination of physical and chemical etching. The physical etching may provide an anisotropic, non-selective etch while the chemical etching may provide an isotropic etch that is selective to etch reactive materials.

Referring to FIG. 5C, after the etching completes, an LED device comprising a mesa 540 and a protrusion region 546 formed on first semiconductor layer 507 can be fabricated, as shown in step 406a. P-contact pad 511 is formed on protrusion region 546. In some examples, as shown in step 406a, a depression region 542 surrounding protrusion region 546 can be formed on mesa 540, similar to μLED device 300 of FIG. 3A.

In some examples, any remaining photoresist material 520 can be removed using wet chemical resist or selective dry etching, and another etching operation can be performed to etch away all of first semiconductor layer 507 above light emitting layer 508 except protrusion region 546, which is masked by P-contact pad 511. Optionally, an insulator material 550, such as SiOx, SiNx, BCB, etc., can be deposited around protrusion region 546 and extend towards the perimeter of light emitting layer 508, to insulate protrusion region 546. An LED device similar to μLED device 300 of FIG. 3G can be formed, as shown in step 406b.

After the LED device is formed, additional processing steps (not shown in FIG. 4 and FIG. 5A-FIG. 5C) can be formed to allow the LED device to be integrated in a display. For example, an N-contact pad (e.g., N-contact pad 312) can be formed on second semiconductor layer 509. Moreover, a passivation layer (e.g., an inert film) can be formed to cover first semiconductor layer 507 and second semiconductor layer 509, while exposing P-contact pads and N-contact pads, to reduce surface leakage currents and to improve electrical characteristics of the LED device. Interconnects (e.g., metal wires, vias, etc.) can be also be formed to provide electrical connections to the P-contact and N-contact pads.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A light emitting diode (LED) device, comprising:
an electrical contact; and
an epitaxial structure including:
a first doped semiconductor layer;
a second doped semiconductor layer; and
a quantum well layer between the first doped semiconductor layer and the second doped semiconductor layer,
wherein the electrical contact is formed on the first doped semiconductor layer;
wherein the first doped semiconductor layer comprises a protrusion region between the electrical contact and the quantum well layer, and a depression region surrounding the protrusion region; and
wherein at least the second doped semiconductor layer forms a mesa, a sidewall of the mesa having an internal parabolic reflective surface.

2. The LED device of claim 1, wherein the depression region is above the quantum well layer;
wherein the depression region restricts lateral charge travel paths within the first doped semiconductor layer between the protrusion region and a perimeter of the first doped semiconductor layer.

3. The LED device of claim 2, wherein the depression region is a first depression region; and
wherein the LED device further comprises a second depression region surrounding the first depression region and the electrical contact.

4. The LED device of claim 2, wherein the depression region has a curved sidewall.

5. The LED device of claim 2, wherein the depression region has a vertical sidewall.

6. The LED device of claim 2, wherein the depression region has a flat bottom surface.

7. The LED device of claim 2, wherein the depression region has a curved bottom surface.

8. The LED device of claim 2, wherein the depression region does not fully enclose the electrical contact.

9. The LED device of claim 1, wherein the depression region touches the quantum well layer at one or more locations such that a thickness of the first doped semiconductor layer between the depression region and the quantum well layer at the one or more locations is smaller than a thickness of the protrusion region.

10. The LED device of claim 1, wherein the depression region intersects the quantum well layer and divides the quantum well layer into a plurality of regions.

11. The LED device of claim 10, further comprising one or more charge blocking layers at one or more interfaces between the depression region and the quantum well layer to block charges from bypassing the quantum well layer via the one or more interfaces.

12. The LED device of claim 1, further comprising an insulation material surrounding the protrusion region.

13. The LED device of claim 12, wherein the insulation material extends to a perimeter of the quantum well layer.

14. The LED device of claim 12, wherein the insulation material comprises at least one of: a silicon oxide material, a silicon nitride material, or a polymer.

15. The LED device of claim 1, wherein the protrusion region is connected to the quantum well layer at a point that is co-located with a focal point of the internal parabolic reflective surface.

16. The LED device of claim 1, wherein the first doped semiconductor layer includes a P-type semiconductor material; and
wherein the second doped semiconductor layer include an N-type semiconductor material.

17. The LED device of claim 1, wherein the epitaxial structure includes at least one of: an indium aluminum gallium phosphide (InAlGaP) material, a gallium nitride (GaN) material, a gallium arsenide (GaAs) material, or a gallium phosphide (GaP) material.

18. The LED device of claim 1, wherein the mesa has a circular base or a square base.

19. A method, comprising:
forming an epitaxial structure having a light emitting layer sandwiched between a first semiconductor layer and a second semiconductor layer on a substrate;
forming an electrical contact on the epitaxial structure, the electrical contact being formed over a center of the light emitting layer;
depositing a photoresist material over the electrical contact and the epitaxial structure;
heating the photoresist material and the epitaxial structure to form a parabolic photoresist overlapping with the electrical contact;
etching the epitaxial structure using the photoresist material to create a protrusion region in the first semiconductor layer between the electrical contact and the light emitting layer and a mesa including at least the second semiconductor layer, a sidewall of the mesa having an internal parabolic reflective surface; and
forming an light emitting diode (LED) device comprising the mesa and the protrusion region having the electrical contact on the epitaxial structure as a result of the etching.

20. A light emitting diode (LED) device, comprising:
an electrical contact; and
a first semiconductor layer;
a second semiconductor layer;
a quantum well layer; and
a depression region;
wherein:
the electrical contact is formed on the first semiconductor layer;
the first semiconductor layer includes a first protrusion region;
the second semiconductor layer includes a second protrusion region;
the quantum well layer is formed between the first protrusion region of the first semiconductor layer and the second protrusion region of the second semiconductor layer; and
the depression region surrounds the first protrusion region, the second protrusion region, and the quantum well layer and is part of at least of the first semiconductor layer, the quantum well layer, or the second semiconductor layer.

21. The LED device of claim 20, wherein at least the second semiconductor layer forms a mesa, a sidewall of the mesa having an internal parabolic reflective surface.

* * * * *